(12) United States Patent
Awano et al.

(10) Patent No.: US 11,291,148 B2
(45) Date of Patent: Mar. 29, 2022

(54) COMPONENT SUPPLY DEVICE AND COMPONENT MOUNTING DEVICE

(71) Applicant: YAMAHA HATSUDOKI KABUSHIKI KAISHA, Iwata (JP)

(72) Inventors: Yukinari Awano, Iwata (JP); Tomoyuki Koeda, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 92 days.

(21) Appl. No.: 16/753,324

(22) PCT Filed: Oct. 31, 2017

(86) PCT No.: PCT/JP2017/039351
§ 371 (c)(1),
(2) Date: Apr. 2, 2020

(87) PCT Pub. No.: WO2019/087301
PCT Pub. Date: May 9, 2019

(65) Prior Publication Data
US 2020/0281104 A1 Sep. 3, 2020

(51) Int. Cl.
*H05K 13/04* (2006.01)
*H05K 13/08* (2006.01)

(52) U.S. Cl.
CPC ....... *H05K 13/0419* (2018.08); *H05K 13/046* (2013.01); *H05K 13/0409* (2018.08); *H05K 13/081* (2018.08)

(58) Field of Classification Search
CPC .......... H05K 13/0409; H05K 13/0419; H05K 13/046; H05K 13/081
See application file for complete search history.

(56) References Cited

U.S. PATENT DOCUMENTS

| | | | | |
|---|---|---|---|---|
| 5,310,301 A | * | 5/1994 | Aono ................ | H05K 13/0419 414/416.08 |
| 5,342,474 A | * | 8/1994 | Mohara ............. | H05K 13/0417 156/751 |
| 5,419,802 A | * | 5/1995 | Nakatsuka ......... | H05K 13/0417 156/750 |
| 6,026,885 A | * | 2/2000 | Mogi ................ | H05K 13/0419 156/750 |

(Continued)

FOREIGN PATENT DOCUMENTS

| CN | 101600334 A | 12/2009 |
|---|---|---|
| CN | 101959397 A | 1/2011 |

(Continued)

OTHER PUBLICATIONS

An Office Action mailed by China National Intellectual Property Administration dated Jul. 5, 2021 which corresponds to Chinese U.S. Appl. No. 16/753,324.9 and is related to U.S. Appl. No. 16/753,324 with English language translation.

(Continued)

*Primary Examiner* — Carl J Arbes
(74) *Attorney, Agent, or Firm* — Studebaker & Brackett PC

(57) ABSTRACT

In a component supply device, an opener is configured to move in a second direction with movement of a tape in the second direction when the tape is fed in the second direction opposite to a first direction in which the tape is fed from a tape feeder to the opener.

20 Claims, 8 Drawing Sheets

(56) References Cited

U.S. PATENT DOCUMENTS

| | | | | |
|---|---|---|---|---|
| 6,032,845 | A * | 3/2000 | Piccone | B65H 20/22 226/139 |
| 6,269,860 | B1 * | 8/2001 | Ishikawa | H05K 13/0417 156/750 |
| 6,402,452 | B1 * | 6/2002 | Miller | H05K 13/0419 414/412 |
| 7,866,518 | B2 * | 1/2011 | Wada | B65H 20/20 226/128 |
| 9,968,019 | B2 * | 5/2018 | Tanokuchi | H05K 13/0419 |
| 10,257,970 | B2 * | 4/2019 | Ohyama | H05K 13/0419 |
| 2011/0072654 | A1 * | 3/2011 | Oyama | H05K 13/0417 29/832 |
| 2011/0243695 | A1 * | 10/2011 | Hwang | H05K 13/0419 414/412 |
| 2015/0110588 | A1 * | 4/2015 | Ohyama | H05K 13/0417 414/411 |

FOREIGN PATENT DOCUMENTS

| | | |
|---|---|---|
| CN | 104663013 A | 5/2015 |
| CN | 105684567 A | 6/2016 |
| CN | 107079613 A | 8/2017 |
| JP | 2012038760 A | 2/2012 |
| JP | 2015-220297 A | 12/2015 |
| JP | 5985275 B2 | 9/2016 |
| WO | 1998037746 A1 | 8/1998 |
| WO | 2017168641 A1 | 10/2017 |

OTHER PUBLICATIONS

International Search Report issued in PCT/JP2017/039351; dated Jan. 16, 2018.

Written Opinion issued in PCT/JP2017/039351; dated Jan. 16, 2018.

An Office Action mailed by China National Intellectual Property Administration dated Oct. 26, 2020, which corresponds to Chinese U.S. Appl. No. 16/753,324.9 and is related to U.S. Appl. No. 16/753,324 with English language translation.

* cited by examiner

FIRST EMBODIMENT

COMPARATIVE EXAMPLE

COMPONENT SUPPLY DEVICE AND COMPONENT MOUNTING DEVICE

CROSS-REFERENCE TO RELATED APPLICATION

This application is a National Stage of International Patent Application No. PCT/JP2017/039351, filed Oct. 31, 2017, the entire content of which is incorporated herein by reference.

BACKGROUND

Technical Field

The present disclosure relates to a component supply device and a component mounting device, and more particularly, it relates to a component supply device and a component mounting device each including an opener configured to expose components.

Background Art

In general, a component supply device and a component mounting device each including an opener configured to expose components are known. A component supply device is disclosed in Japanese Patent No. 5985275, for example.

Japanese Patent No. 5985275 discloses a feeder (component supply device) including first to third sprockets configured to feed a supply tape (tape) in a downstream direction, and a pressing mechanism configured to press the supply tape toward the first sprocket. The supply tape includes a carrier tape including pockets (storages) configured to store electronic components (components), and a cover tape configured to cover the carrier tape.

The pressing mechanism includes a cutter (opener) configured to separate the cover tape from the carrier tape, and an outlet port (extraction hole) arranged downstream of the cutter and between the first sprocket and the second sprocket, and through which a suction nozzle of a mounting head suctions an electronic component. The cutter is inserted between the carrier tape and the cover tape, the cover tape is placed on the cutter, and a tensile force applied to the cover tape is increased such that the cover tape is cut, and the electronic components in the pockets are exposed.

In the feeder, a transfer operation for engaging the respective teeth of the first sprocket, the second sprocket, and the third sprocket with sprocket holes of the supply tape is performed. As the transfer operation, in the first sprocket at the most downstream side, the sprocket hole is slightly slid with respect to the teeth of the first sprocket, and then the third sprocket is reversely rotated to pull back the supply tape such that the teeth of the first sprocket conceivably engage with the sprocket hole of the supply tape.

SUMMARY

In the feeder disclosed in Japanese Patent No. 5985275, when the supply tape is fed from the second sprocket to the first sprocket, the cover tape is cut while the cover tape is placed on the cutter. Accordingly, when the supply tape is pulled back at the time of transfer to the first sprocket, only the supply tape is pulled back while the position of the cutter is maintained, and thus a state in which the cover tape is placed on the cutter is released. When the supply tape is fed again after the state in which the cover tape is placed on the cutter is released, the cover tape passes between the tip of the cutter and the carrier tape, and thus the cutter is not inserted between the carrier tape and the cover tape such that the cover tape cannot be placed on the cutter. Consequently, there is a disadvantage that cutting of the cover tape may not be performed continuously. Therefore, there is a problem that the electronic components (components) may not be continuously exposed from the supply tape when the supply tape (tape) is fed again.

Accordingly, the present disclosure provides a component supply device and a component mounting device each capable of continuously exposing components from a tape when the tape is fed again after the tape is pulled back.

A component supply device according to a first aspect of the present disclosure includes a tape feeder configured to feed a tape including a carrier tape having a storage configured to store a component and a cover tape configured to cover an upper opening of the storage, and a tape guide including an opener configured to open the upper opening of the storage covered with the cover tape and expose the component, and an extraction hole through which the component exposed by the opener is extracted, the tape guide being configured to guide the tape. The opener is configured to move in a second direction with movement of the tape in the second direction when the tape is fed in the second direction opposite to a first direction in which the tape is fed from the tape feeder to the opener.

In the component supply device according to the first aspect of the present disclosure, as described above, even when the tape moves in the second direction from the first direction when the upper opening of the storage of the carrier tape is opened by the opener, the opener moves in the second direction in accordance with the movement of the tape, and thus a change in the positional relationship between the tape and the opener can be significantly reduced or prevented. Accordingly, the tape and the opener move in the second direction while the positional relationship between the tape and the opener is maintained such that a state in which the cover tape is placed on the opener can be maintained. Thus, the opener can maintain a state in which the upper opening of the storage of the carrier tape is openable. Consequently, when the tape is fed again, the opener maintains a state in which the upper opening of the storage of the carrier tape is openable, and thus the component can be continuously exposed from the tape when the tape is fed again after being moved in the second direction.

In the aforementioned component supply device according to the first aspect, the opener is preferably configured to be slid in the second direction with the movement of the tape in the second direction due to a frictional force between at least one of the opener or the tape guide and the tape. According to this structure, the opener is slidable in the second direction due to the frictional force, and thus it is not necessary to separately provide a drive source configured to slide the opener in the second direction. Thus, the structure of the component supply device can be simplified.

The aforementioned component supply device according to the first aspect preferably further includes a first engagement portion configured to engage with the tape guide so as to urge the tape guide against the tape, and a second engagement portion provided in the tape guide and configured to engage with the first engagement portion, and the second engagement portion is preferably configured to engage with the first engagement portion in such a manner that the tape guide including the opener is movable in the second direction with the movement of the tape in the second direction due to a frictional force between the tape guide against which the second engagement portion is urged and the tape. According to this structure, using the engagement relationship between the first engagement portion and the second engagement portion, the frictional force that allows the tape guide including the opener to move in the second direction with the movement of the tape in the second direction can be generated between the tape guide and the tape. Consequently, it is not necessary to separately provide a structure configured to generate a frictional force, and thus the structure of the component supply device can be simplified.

In the aforementioned component supply device including the second engagement portion, the second engagement portion preferably includes a first restrictor configured to restrict an amount of movement of the second engagement portion with respect to the first engagement portion corresponding to an amount of movement of the tape guide including the opener in the second direction with the movement of the tape in the second direction. According to this structure, the amount of movement of the tape guide including the opener in the second direction can be restricted by the second engagement portion including the first restrictor, and thus it is not necessary to separately provide a member configured to restrict the amount of movement. Thus, the structure can be simplified.

In the aforementioned component supply device including the first engagement portion and the second engagement portion, the first engagement portion preferably includes a first downstream engagement portion disposed downstream of the extraction hole in the first direction, and a first upstream engagement portion disposed upstream of the extraction hole in the first direction, and the second engagement portion preferably includes a second downstream engagement portion corresponding to the first downstream engagement portion, and a second upstream engagement portion corresponding to the first upstream engagement portion. According to this structure, the first upstream engagement portion and the first downstream engagement portion press the second upstream engagement portion and the second downstream engagement portion, respectively, such that the tape guide is pressed upstream and downstream of the extraction hole, and thus a pressing force can be applied to the entire tape guide as compared with the case in which an urging force is applied to one location.

In the aforementioned component supply device in which the tape guide is configured to move in the second direction together with the tape, the tape guide is preferably configured to move in the first direction with movement of the tape in the first direction when the tape moves in the first direction after the tape guide moves in the second direction with the movement of the tape in the second direction. According to this structure, in addition to moving the tape guide in the second direction in accordance with the movement of the tape in the second direction, the tape guide can return to the original position with the movement of the tape in the first direction. Consequently, within a certain space (moving range), the tape guide can repeatedly move in accordance with the movement of the tape in the second direction and then return in the first direction, and thus a space in the component supply device can be effectively used.

In this case, the second engagement portion preferably includes a second restrictor configured to restrict an amount of movement of the second engagement portion with respect to the first engagement portion corresponding to an amount of movement of the tape guide including the opener in the first direction with the movement of the tape in the first direction, and the movement of the tape guide in the first direction is preferably restricted such that the second restrictor stops the tape guide at a position at which the extraction hole and the upper opening of the storage communicate with each other. According to this structure, the position of the extraction hole, which is shifted when the tape guide is moved in the second direction, with respect to the upper opening of the storage can return to a position at which the extraction hole and the upper opening of the storage are aligned with each other when the tape guide is moved in the first direction, and thus the component can be easily extracted from the storage when the tape is fed again.

The aforementioned component supply device including the first engagement portion preferably further includes a fixing member configured to fix the tape guide, and the first engagement portion is preferably provided on the fixing member. According to this structure, the existing fixing member configured to fix the tape guide can be used to provide the first engagement portion, and thus the structure of the component supply device can be further simplified.

In the aforementioned component supply device including the tape guide including the opener, the tape guide is preferably fixed, and the opener is preferably attached to the tape guide in such a manner as to be relatively movable with respect to the tape guide, and is preferably configured to be moved in the second direction with the movement of the tape in the second direction due to a frictional force between the opener and the tape in a state in which a position of the tape guide is maintained when the tape is moved in the second direction. According to this structure, only the opener is configured to be moved in the second direction such that a frictional force required to move the opener in the second direction can be reduced as compared with the case in which both the opener and the tape guide are moved in the second direction. Accordingly, the drive load of the tape feeder can be reduced.

A component mounting device according to a second aspect of the present disclosure includes a head unit including a head configured to mount a component on a substrate, and a component supply device configured to supply the component to the head. The component supply device includes a tape feeder configured to feed a tape including a carrier tape having a storage configured to store the component and a cover tape configured to cover an upper opening of the storage, and a tape guide including an opener configured to open the upper opening of the storage covered with the cover tape and expose the component, and an extraction hole through which the component exposed by the opener is extracted, the tape guide being configured to guide the tape, and the opener is configured to move in a second direction with movement of the tape in the second direction when the tape is fed in the second direction opposite to a first direction in which the tape is fed from the tape feeder to the opener.

In the component mounting device according to the second aspect of the present disclosure, as described above, the component supply device can continuously expose the component from the tape when the tape is fed again after the tape is pulled back. Thus, the component can be reliably supplied to the head of the head unit.

According to the present disclosure, as described above, it is possible to provide the component supply device and the component mounting device each capable of continuously exposing the components from the tape when the tape is fed again after the supply tape is pulled back.

DETAILED DESCRIPTION

Embodiments embodying the present disclosure are hereinafter described on the basis of the drawings.

First Embodiment

A component mounting device 1 according to a first embodiment of the present disclosure is described with reference to FIGS. 1 to 13.

(Structure of Component Mounting Device)

The structure of the component mounting device 1 according to the embodiment of the present disclosure is now described with reference to FIG. 1. The conveyance direction of a substrate B and the opposite direction are defined as an X direction, and a direction orthogonal to the X direction in a horizontal direction is defined as a Y direction. A direction orthogonal to the X direction and the Y direction is defined as a Z direction.

Figure 1:
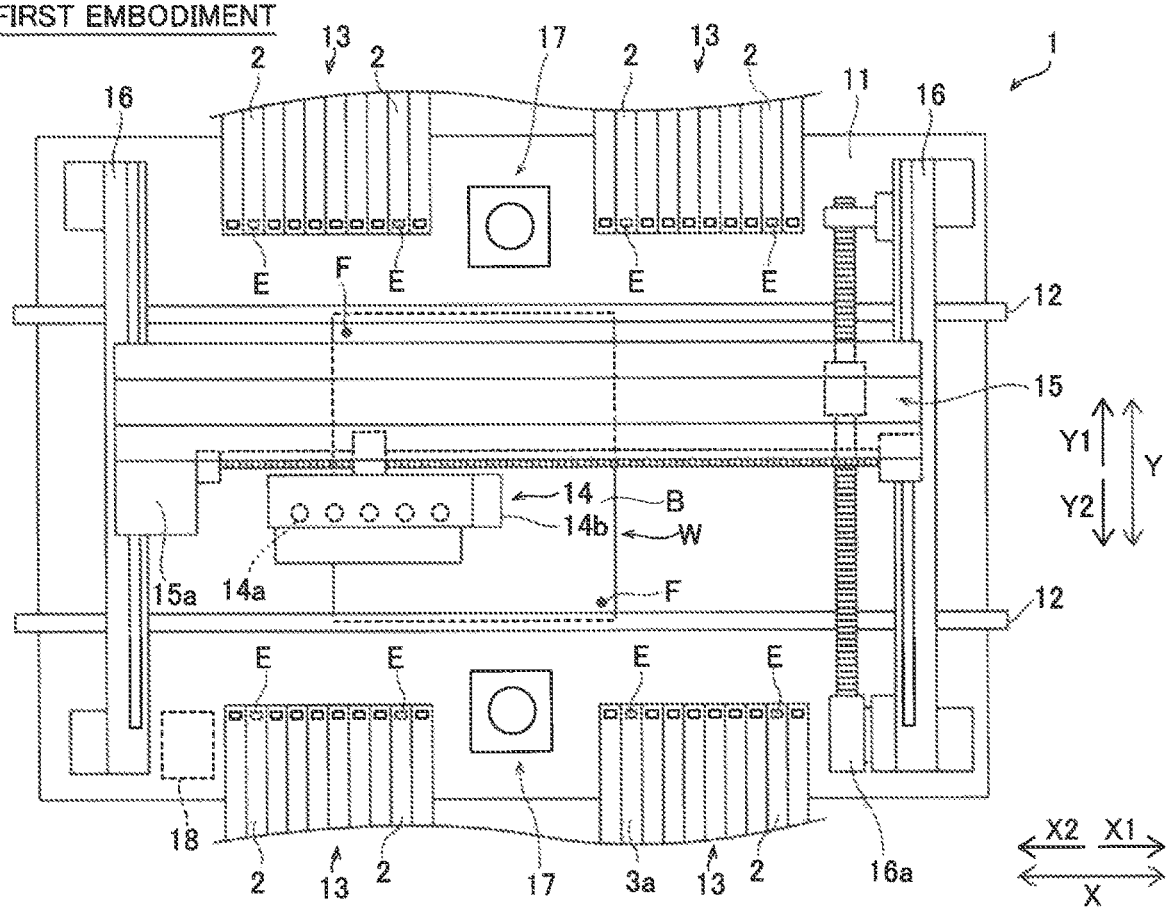
FIG. 1 is a diagram showing the overall structure of a component mounting device according to a first embodiment of the present disclosure.

As shown in FIG. 1, the component mounting device 1 is a component mounting device 1 configured to convey the substrate B in the X direction by a pair of conveyors 12 and to mount electronic components E on the substrate B at a mounting operation position W. The electronic components E include electronic components E such as ICs, transistors, capacitors, and resistors.

The component mounting device 1 includes a base 11, the pair of conveyors 12, component feeders 13, a head unit 14, a support 15, a pair of rails 16, component recognition cameras 17, and a controller 18.

The pair of conveyors 12 are installed on the base 11 and are configured to convey the substrate B in the X direction. In addition, the pair of conveyors 12 include a holding mechanism (not shown) that holds the substrate B being conveyed in a stopped state at the mounting operation position W. Moreover, an interval between the pair of conveyors 12 in the Y direction can be adjusted according to the dimensions of the substrate B.

The component feeders 13 are disposed outside (Y1 and Y2 sides) of the pair of conveyors 12. A plurality of component supply devices 2 are disposed in the component feeders 13. The plurality of component supply devices 2 of the component feeders 13 are configured to supply the components to mounting heads 14a described below.

Figure 2:
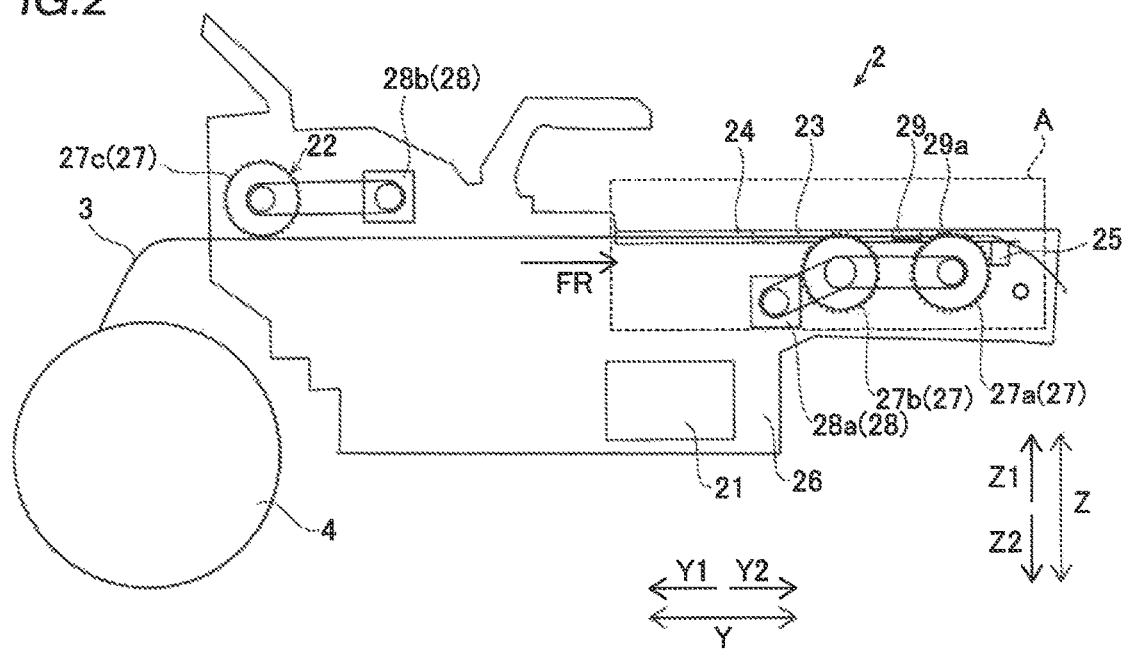
FIG. 2 is a schematic view showing a component supply device according to the first embodiment of the present disclosure.

As shown in FIG. 2, the component supply devices 2 hold reels 4 on which tapes 3 that hold a plurality of electronic components E (see FIG. 1) at a predetermined interval are wound. The component supply devices 2 are configured to supply the electronic components E from the tips of the component supply devices 2 on the mounting operation position W side by rotating the reels 4 to feed the tapes 3 that hold the electronic components E. The component supply devices 2 are described in detail below.

As shown in FIG. 1, the head unit 14 is disposed above the pair of conveyors 12 and the component feeders 13, and includes a plurality of (five) mounting heads 14a including nozzles attached to their lower ends and a substrate recognition camera 14b.

The mounting heads 14a are configured to mount the electronic components E supplied from the component supply devices 2 on the substrate B. Specifically, the mounting heads 14a are configured to suction the electronic components E supplied by the component supply devices 2 and to mount the suctioned electronic components E on the substrate B disposed at the mounting operation position W. The mounting heads 14a are movable up and down (movable in the Z direction). Furthermore, the mounting heads 14a are configured to suction and hold the electronic components E supplied from the component supply devices 2 by a negative pressure generated at the tips of the nozzles by a negative pressure generator (not shown) and to mount the electronic components E at mounting positions on the substrate B.

The substrate recognition camera 14b is configured to image fiducial marks F of the substrate B in order to recognize the position and the orientation of the substrate B. The positions of the fiducial marks F are imaged and recognized such that the mounting positions of the electronic components E on the substrate B can be accurately acquired.

The support 15 includes a motor 15a. The support 15 is configured to move the head unit 14 in the X direction along the support 15 by driving the motor 15a. Opposite ends of the support 15 are supported by the pair of rails 16.

The pair of rails 16 are fixed on the base 11. A rail 16 on the X1 side includes a motor 16a. The rails 16 are configured to move the support 15 in the Y direction orthogonal to the X direction along the pair of rails 16 by driving the motor 16a. The head unit 14 is movable in the X direction along the support 15, and the support 15 is movable in the Y direction along the rails 16 such that the head unit 14 is movable in the horizontal direction (XY direction).

The component recognition cameras 17 are fixed on the upper surface of the base 11. The component recognition cameras 17 are disposed outside (Y1 and Y2 sides) of the pair of conveyors 12. The component recognition cameras 17 are configured to image the electronic components E suctioned by the nozzles of the mounting heads 14a from below (Z2 side) in order to recognize the suction states (suction orientations) of the electronic components E prior to mounting of the electronic components E. Thus, the suction states of the electronic components E suctioned by the nozzles of the mounting heads 14a can be acquired by the controller 18.

The controller 18 includes a CPU and a memory, and is configured to control the overall operation of the component mounting device 1 such as the substrate B conveying operation performed by the pair of conveyors 12, the mounting operation performed by the head unit 14, and the imaging operations performed by the component recognition cameras 17 and the substrate recognition camera 14b. Moreover, the controller 18 is configured to be able to communicate with a controller 21 (see FIG. 2) of each of the component supply devices 2. The controller 18 is configured to control the mounting operation in cooperation with the controller 21 of each of the plurality of component supply devices 2.

(Structure of Component Supply Device)

The structure of each of the component supply devices 2 is now described with reference to FIGS. 2 to 13. Note that the component supply devices 2 are auto-loading feeders that can automatically load the tapes 3. In the following description, a component supply device 2 disposed on the Y1 side of the component mounting device 1 is described.

As shown in FIG. 2, the component supply device 2 includes the controller 21, a tape feeding device 22, a tape guide 23, a first mount 24, a second mount 25, and a supply device main body 26. The controller 21, the tape guide 23, the first mount 24, and the second mount 25 are disposed in a downstream region in a tape feed direction FR. The tape feed direction FR is an example of a "first direction" in the claims. Each of the first mount 24 and the second mount 25 is an example of a "fixing member" in the claims. The tape feeding device 22 is an example of a "tape feeder" in the claims.

The tape feeding device 22 includes sprockets 27 and motors 28. The tape guide 23 includes an opener 29 and an extraction hole 29a through which each of the mounting heads 14a extracts an electronic component E. The controller 21, the tape feeding device 22, the first mount 24, and the second mount 25 are attached to the supply device main body 26. The tape guide 23 is attached to the supply device main body 26 using the first mount 24 and the second mount 25 (see FIG. 4).

Figure 3A:
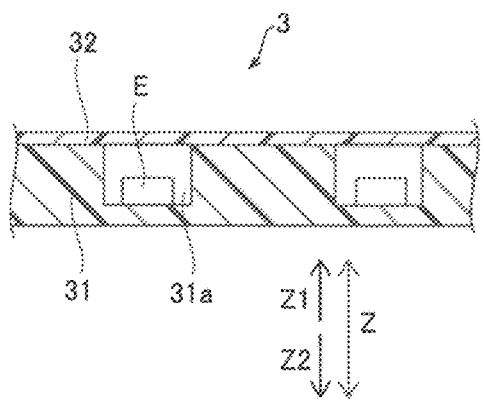
FIG. 3A is a sectional view schematically showing a carrier tape and a cover tape.

Each of the tapes 3 includes a carrier tape 31 and a cover tape 32, as shown in FIG. 3A. The carrier tape 31 includes storages 31a, each of which stores an electronic component E. The storages 31a each have a space larger than the size of the electronic component E. An opening of the storage 31a in a Z1 direction (upward direction) is covered with the cover tape 32. Thus, it is possible to prevent the electronic component E from coming out of the storage 31a before component supply. At the time of component supply, the cover tape 32 is cut open such that the upper opening of the storage 31a is exposed. Thus, at a component extraction position, the electronic component E can be extracted from the storage 31a by the mounting head 14a.

Figure 3B:
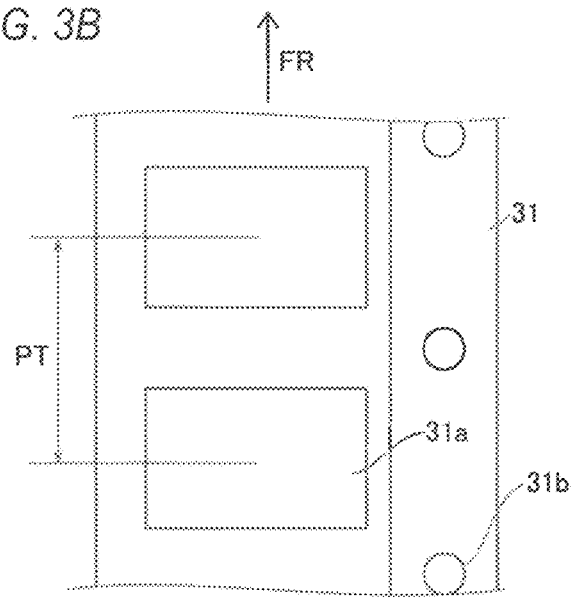
FIG. 3B is a plan view schematically showing a tape as viewed from above.

The carrier tape 31 includes a plurality of engagement holes 31b that engage with the sprockets 27, as shown in FIG. 3B. The plurality of engagement holes 31b are disposed at a constant interval (feed pitch PT) in the tape feed direction FR. Note that the feed pitch PT is equal to a distance between the center of the storage 31a and the center of the storage 31a adjacent thereto. The engagement holes 31b are disposed at predetermined relative positions with respect to the storages 31a.

The controller 21 is configured to control driving of the component supply device 2, as shown in FIG. 2. Specifically, the controller 21 is configured to control driving of the motors 28 to control the tape 3 feeding operation. The controller 21 includes a substrate including a control circuit. The controller 21 is configured to control the tape 3 feeding operation based on the tape 3 detection result by a sensor (not shown) provided in the component supply device 2.

The sprockets 27 include a first sprocket 27a, a second sprocket 27b, and a third sprocket 27c. The first sprocket 27a is provided downstream of the opener 29 in the tape feed direction FR. The second sprocket 27b is provided upstream of the opener 29 in the tape feed direction FR. The first sprocket 27a and the second sprocket 27b are provided below a conveyance path for the tape 3. The third sprocket 27c is provided on the tape 3 entrance side of the component supply device 2. The third sprocket 27c is provided above the conveyance path for the tape 3.

The motors 28 include a first motor 28a and a second motor 28b. Driving of the first motor 28a and the second motor 28b is controlled by the controller 21, and the first motor 28a and the second motor 28b are driven.

The first motor 28a drives the first sprocket 27a and the second sprocket 27b in conjunction with each other. That is, the first sprocket 27a and the second sprocket 27b are connected to each other by a belt, and are rotated synchronously. The second motor 28b drives the third sprocket 27c. Thus, the first to third sprockets 27a, 27b, and 27c are configured to engage with the engagement holes 31b (see FIG. 3B) of the tape 3 and to feed the tape 3 in the tape feed direction FR.

<First Mount>

Figure 4:
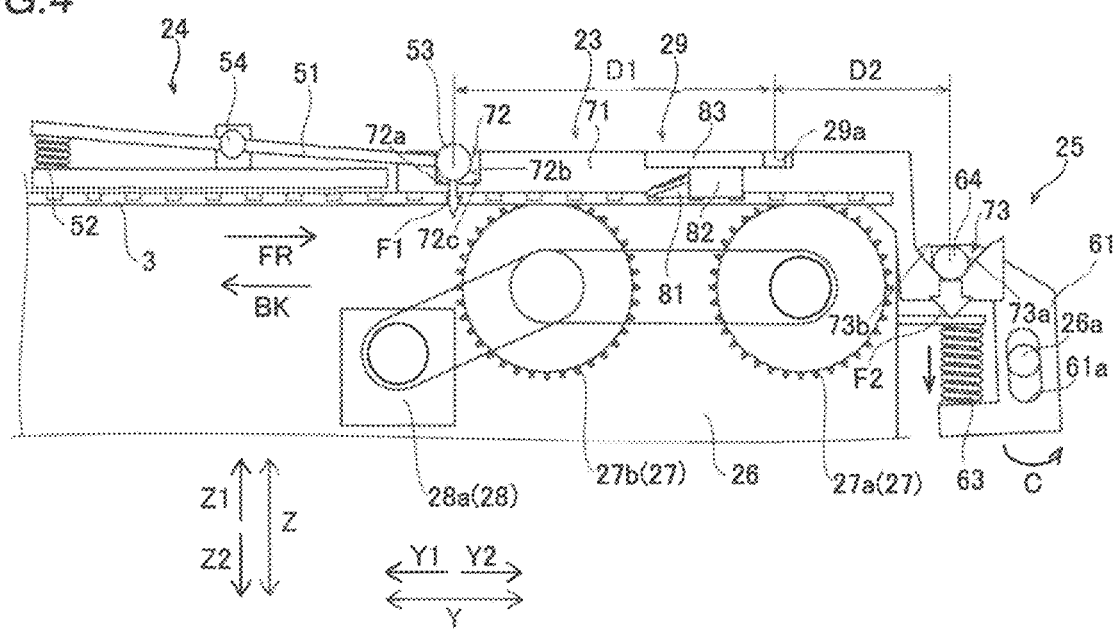
FIG. 4 is a schematic view showing a portion A in FIG. 2.

As shown in FIG. 4, the first mount 24 is configured to press, in a Z2 direction (downward direction), an end of the tape guide 23 in a direction (hereinafter referred to as a backward direction BK) opposite to the tape feed direction FR. Specifically, the first mount 24 includes a cover 51, an urging portion 52 provided on the back surface of the end of the cover 51 on the backward direction BK side, and a shaft 53 provided at an end of the cover 51 on the tape feed direction FR side. The shaft 53 is an example of a "first engagement portion" or a "first upstream engagement portion" in the claims. The backward direction BK is an example of a "second direction" in the claims.

Figure 5:
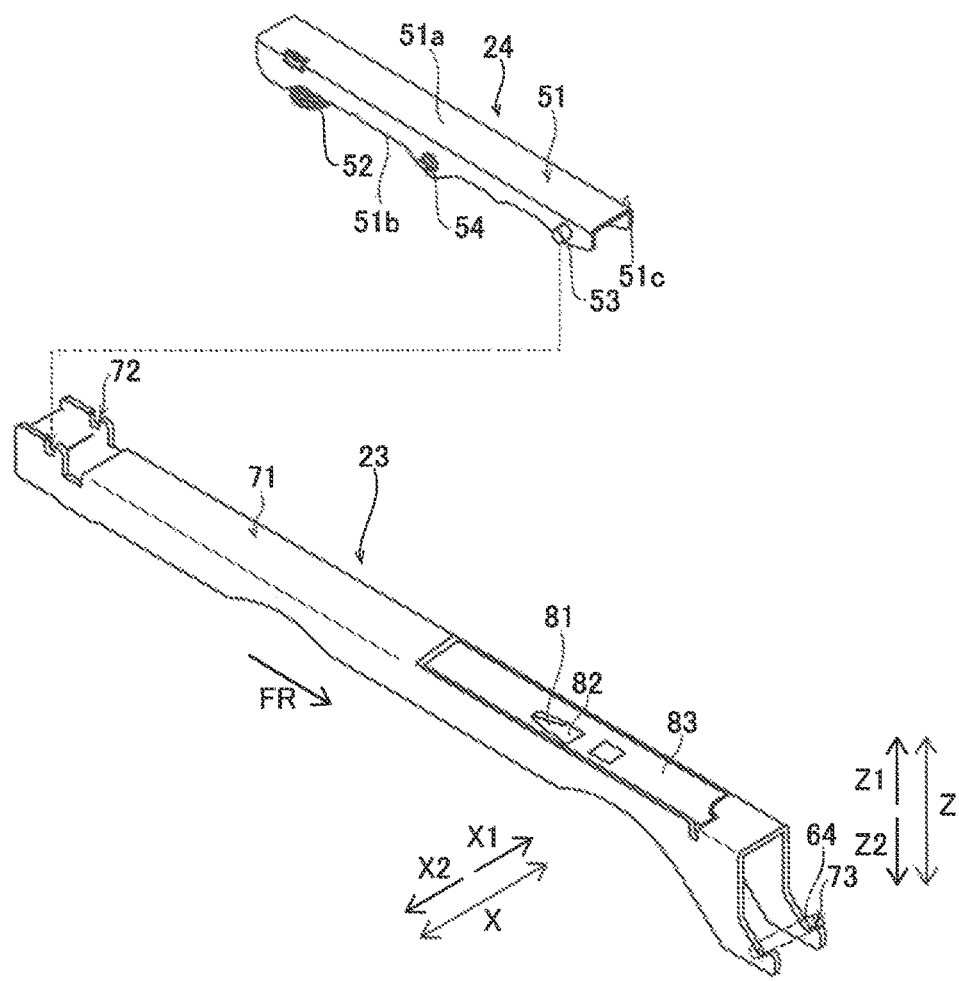
FIG. 5 is a perspective view schematically showing a first mount and a tape guide in the component mounting device according to the first embodiment of the present disclosure.

As shown in FIG. 5, the cover 51 includes an upper surface portion 51a and a pair of side surface portions 51b and 51c. The urging portion 52 is arranged in such a manner that its end on the Z1 side (upper side) is attached to the back surface of the upper surface portion 51a of the cover 51, and its end on the Z2 side (lower side) contacts the supply device main body 26. The shaft 53 is provided on each of the pair of side surface portions 51b and 51c. The shaft 53 protrudes in directions opposite to directions toward side surface portions that the pair of side surface portions 51b and 51c face, respectively. The shaft 53 has a columnar shape.

The first mount 24 includes a rotation shaft 54 configured to rotate the cover 51 about a rotation shaft 54 axis in a direction along the X direction. The rotation shaft 54 is disposed in a central portion of the cover 51 in the tape feed direction FR, and penetrates the pair of side surface portions 51b and 51c.

In the first mount 24, as shown in FIG. 4, the end of the cover 51 on the backward direction BK side is urged by the urging portion 52 in the Z1 direction (upward direction), and thus the end of the cover 51 on the tape feed direction FR side is rotated in the Z2 direction (downward direction) about the rotation shaft 54. Thus, the end of the tape guide 23 on the backward direction BK side is pressed in the Z2 direction, and thus the tape guide 23 is urged against the tape 3 in the Z2 direction (downward direction).

<Second Mount>

The second mount 25 is configured to press an end of the tape guide 23 on the tape feed direction FR side. Specifically, the second mount 25 includes a rotating body 61 including a recess on the backward direction BK side, an urging portion 63 disposed in the recess, and a shaft 64 provided at the upper end of the rotating body 61 on the backward direction BK side. On the tape feed direction FR side of the rotating body 61, a long hole 61a that is elongated in the Z direction (upward-downward direction) is formed. A pin 26a fixed to the supply device main body 26 is inserted into the long hole 61a in such a manner as to be movable in the Z direction (upward-downward direction). An end of the urging portion 63 on the Z1 side (upper side) is attached to the supply device main body 26, and an end thereof on the Z2 side (lower side) is attached to the rotating body 61. The shaft 64 has a columnar shape (see FIG. 5) that is long in the direction along the X direction. The shaft 64 of the second mount 25 is an example of a "first engagement portion" or a "first downstream engagement portion" in the claims.

The second mount 25 is configured to rotate the rotating body 61 about an axis in the direction along the X direction due to the pin 26a and the long hole 61a. Specifically, the pin 26a moves in the long hole 61a in the Z direction (upward-downward direction) in a state in which the pin 26a engages with the long hole 61a such that the rotating body 61 can rotate.

In the second mount 25, the lower end of the rotating body 61 on the backward direction BK side is urged in the Z2 direction (downward direction) by the urging portion 63 such that the pin 26a is relatively moved in the downward direction along the long hole 61a, and thus the rotating body 61 is rotated in a C direction. Thus, a force that causes the shaft 64 at the upper end of the rotating body 61 to move to the Z2 side (downward) due to the rotation in the C direction is generated, and thus the end of the tape guide 23 on the tape feed direction FR side is pressed in the Z2 direction.

<Tape Guide>

As shown in FIG. 4, the tape guide 23 is configured to press the tape 3 from the Z1 direction (upper) side and to guide the tape 3 in the tape feed direction FR. Specifically, the tape guide 23 includes a cover 71 and the opener 29 attached to the cover 71.

The shaft 53 of the first mount 24 is inserted into the cover 71 such that a first engagement groove 72 is formed in which the first mount 24 and the tape guide 23 are engaged. The first engagement groove 72 is arranged at a position corresponding to the shaft 53 of the first mount 24. The first engagement groove 72 is formed in the vicinity of an end of the cover 71 on the backward direction BK side, and is recessed in the Z2 direction (downward direction). The first engagement groove 72 has an inner side surface 72a on the backward direction BK side and an inner side surface 72b on the tape feed direction FR side that face each other, and a bottom surface 72c. The inner side surface 72a and the inner side surface 72b are examples of a "second restrictor" and a "first restrictor" in the claims, respectively. The first engagement groove 72 is an example of a "second engagement portion" or a "second upstream engagement portion" in the claims.

The shaft 53 of the first mount 24 engages with the first engagement groove 72 such that movement of the tape guide 23 in the Z1 direction (upward direction), movement of the tape guide 23 in the tape feed direction FR, and movement of the tape guide 23 in the backward direction BK are restricted. In the tape guide 23, the shaft 53 of the first mount 24 engages with the first engagement groove 72 such that the shaft 53 presses, in the Z2 direction (downward direction), the end of the tape guide 23 on the backward direction BK side.

The shaft 64 of the second mount 25 is inserted into the cover 71 such that a second engagement groove 73 is formed in which the second mount 25 and the tape guide 23 are engaged. The second engagement groove 73 is arranged at a position corresponding to the shaft 64 of the second mount 25. The second engagement groove 73 is formed at the end of the cover 71 on the tape feed direction FR side, and is recessed in the Z2 direction. Furthermore, the second engagement groove 73 has a first inclined surface 73a located on the tape feed direction FR side and a second inclined surface 73b located on the backward direction BK side. The first inclined surface 73a is inclined downward in the backward direction BK. The second inclined surface 73b is inclined downward in the tape feed direction FR. The second engagement groove 73 is an example of a "second engagement groove" and a "second downstream engagement portion" in the claims.

The shaft 64 of the second mount 25 engages with the second engagement groove 73 such that movement of the tape guide 23 in the Z1 direction (upward direction), movement of the tape guide 23 in the tape feed direction FR, and movement of the tape guide 23 in the backward direction BK are restricted. In the tape guide 23, the shaft 64 of the second mount 25 engages with the second engagement groove 73 such that the shaft 64 presses, in the Z2 direction, the end of the tape guide 23 on the tape feed direction FR side.

The shaft 53 of the first mount 24 and the shaft 64 of the second mount 25 cause the cover 71 to press the tape 3 from the Z1 direction (upper) side in the tape guide 23, and thus the tape 3 can be guided in the tape feed direction FR. In addition, it is possible to minimize the size of the conveyance path for the tape 3 in the Z direction (upward-downward direction) and significantly reduce or prevent lifting of the tape 3.

As shown in FIG. 4, the moment (hereinafter referred to as a first moment) of a force F1 applied from the shaft 53 of the first mount 24 to the first engagement groove 72 and the moment (hereinafter referred to as a second moment) of a force F2 applied from the shaft 64 of the second mount 25 to the second engagement groove 73 are balanced about the extraction hole 29a.

Specifically, on the cover tape 32, the first engagement groove 72 is located upstream of the extraction hole 29a in the tape feed direction FR, and the second engagement groove 73 is located downstream of the extraction hole 29a in the tape feed direction FR. The first engagement groove 72 is arranged in such a manner that a distance D1 from the extraction hole 29a to the first engagement groove 72 is larger than a distance D2 from the extraction hole 29a to the second engagement groove 73. Furthermore, the force F1 applied from the shaft 53 of the first mount 24 to the first engagement groove 72 is smaller than the force F2 applied from the shaft 64 of the second mount 25 to the second engagement groove 73. The first moment (D1×F1) and the second moment (D2×F2) are balanced about the extraction hole 29a.

<Opener>

Figure 6:
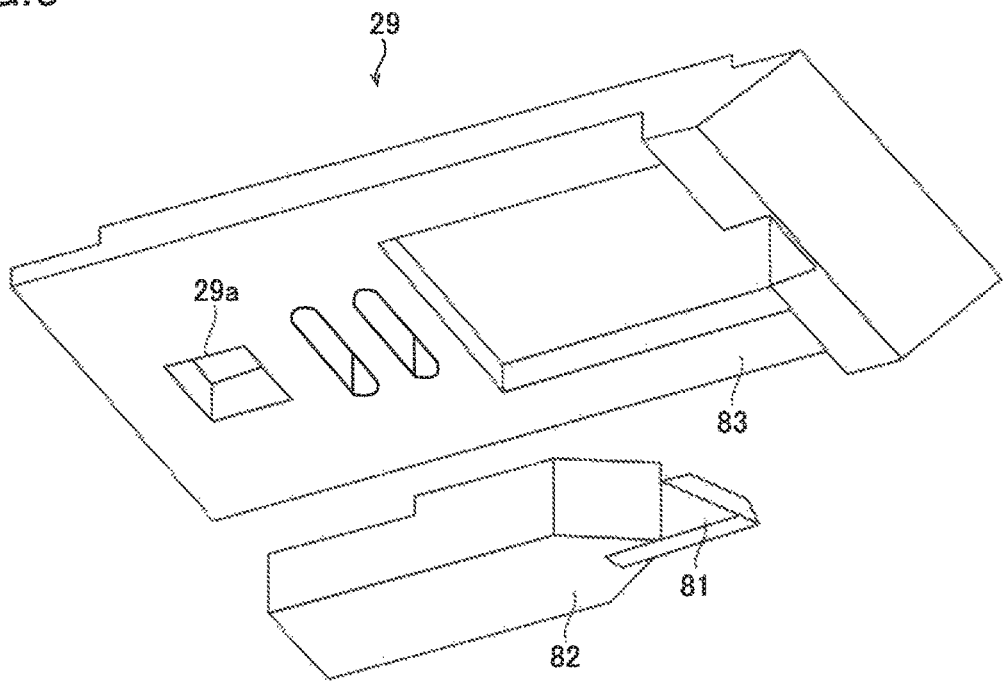
FIG. 6 is a perspective view schematically showing an opener in the component mounting device according to the first embodiment of the present disclosure.

The opener 29 is configured to open the upper opening of the storage 31a covered with the cover tape 32 to expose the electronic component E. The opener 29 includes a cutter 81, a cover tape guide 82, and a mount 83, as shown in FIG. 6. The cutter 81 is configured to insert its cutting edge between the carrier tape 31 and the cover tape 32 to cut the cover tape 32.

In other words, as shown in FIG. 4, the cutter 81 is configured to sequentially cut open the cover tape 32 as the tape 3 moves in the tape feed direction FR. The cover tape guide 82 is configured to press and spread the cut open cover tape 32 to both sides in the X direction. That is, the cover tape guide 82 is configured to sequentially open and spread the cover tape 32 in a width direction (X direction) as the tape 3 moves.

The opener 29 is attached to the cover 71 of the tape guide 23 by the mount 83. That is, in the component supply device 2, the cutter 81 is fixed to the cover tape guide 82, and the opener 29 in which the cover tape guide 82 is fixed to the mount 83 is attached to the tape guide 23.

Furthermore, the mount 83 is provided with the extraction hole 29a through which the mounting head 14a extracts the electronic component E exposed by cutting of the cover tape 32 by the cutter 81. The extraction hole 29a is provided downstream of the cutter 81 in the tape feed direction FR. The extraction hole 29a is a rectangular hole (see FIG. 6) that penetrates in the upward-downward direction (Z direction). Thus, after the upper side of the electronic component E stored in the storage 31a is opened, the component can be extracted by the mounting head 14a.

<Gaps of Predetermined Lengths>

In the component supply device 2, as shown in FIG. 2, after the second sprocket 27b engages with the engagement holes 31b of the tape 3, the tape 3 is fed to the first sprocket 27a due to rotation of the second sprocket 27b. Thereafter, transfer is performed to engage the engagement holes 31b of the tape 3 with the first sprocket 27a. In the transfer, after the engagement holes 31b are slightly slipped with respect to the first sprocket 27a, the second sprocket 27b is reversely rotated to pull back the tape 3 such that the engagement holes 31b of the tape 3 engage with the first sprocket 27a.

Figure 7A:
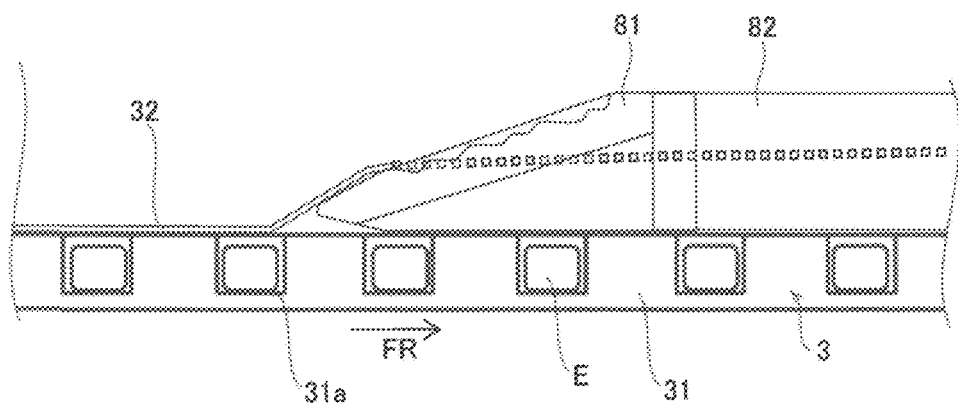
FIG. 7A is a side view schematically showing a state in which a cover tape is cut by a cutter in a component mounting device according to a comparative example of the first embodiment of the present disclosure.
Figure 7B:
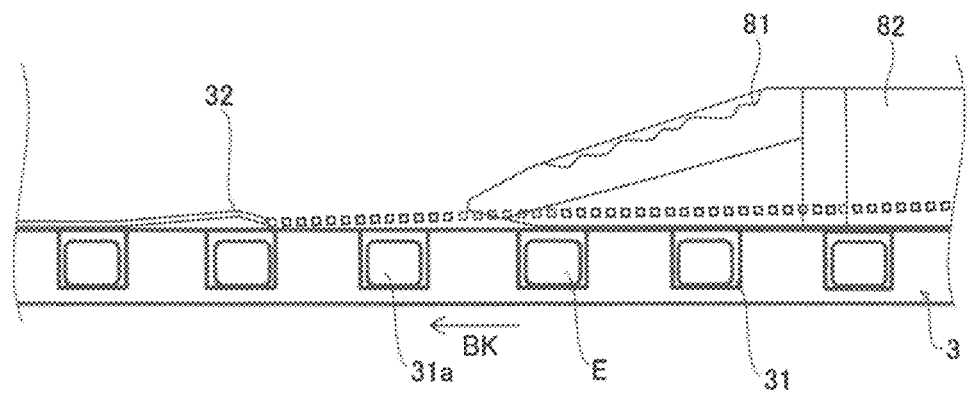
FIG. 7B is a side view schematically showing a state in which a tape is moved in a backward direction when the cover tape is cut by the cutter in the component mounting device according to the comparative example of the first embodiment of the present disclosure.

However, as shown in FIG. 7A, in the component supply device 2, when the tape 3 is fed from the second sprocket 27b to the first sprocket 27a, the cover tape 32 is placed on the cutter 81, and a tensile force applied to the cover tape 32 is increased such that the cover tape 32 is cut. Therefore, as shown in FIG. 7B, when the tape 3 is pulled back at the time of transfer to the first sprocket 27a, the cover tape 32 comes off from the cutter 81. Thus, when the tape 3 is fed again in the feed direction FR, the electronic component E cannot be continuously exposed from the tape 3.

Therefore, in the component supply device 2 according to the first embodiment, gaps of predetermined lengths are provided such that when the tape 3 is fed in the backward direction BK from the tape feed direction FR, the opener 29 moves in the backward direction BK with movement of the tape 3 in the backward direction BK. The gaps of the predetermined lengths are described below with reference to FIGS. 8A to 13.

Figure 8A:
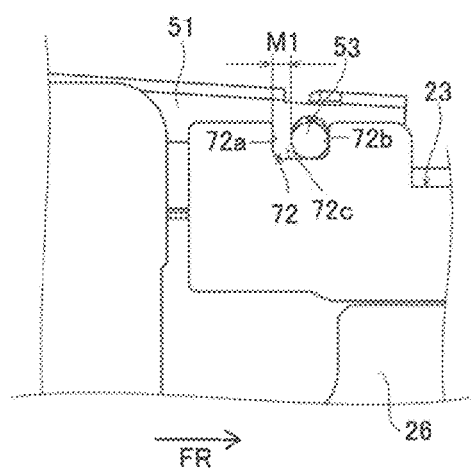
FIG. 8A is an enlarged partial view schematically showing a connection between the first mount and the tape guide in the component supply device according to the first embodiment of the present disclosure.

As shown in FIG. 8A, a gap of a first predetermined length M1 is formed between the first engagement groove 72 of the tape guide 23 and the inserted shaft 53 of the first mount 24. Specifically, the first engagement groove 72 is configured in such a manner that a difference between the length of the first engagement groove 72 in the tape feed direction FR and the length of the shaft 53 of the first mount 24 in the tape feed direction FR corresponds to the gap of the first predetermined length M1.

Figure 8B:
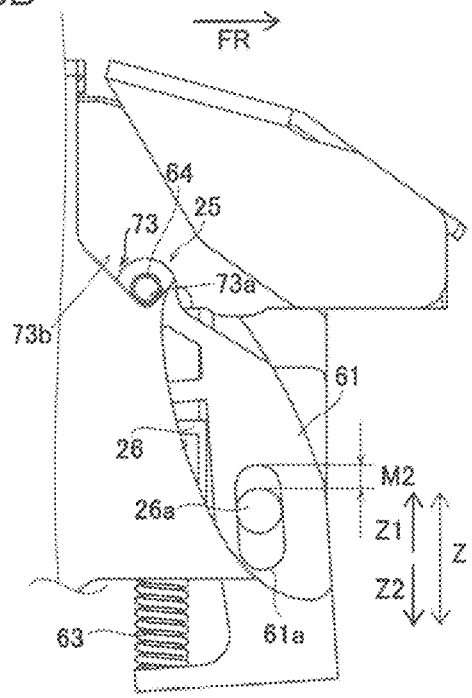
FIG. 8B is an enlarged partial view schematically showing a connection between a second mount and the tape guide in the component supply device according to the first embodiment of the present disclosure.

As shown in FIG. 8B, a gap of a second predetermined length M2 is formed between the long hole 61a of the rotating body 61 of the second mount 25 and the inserted pin 26a. Specifically, the long hole 61a is configured in such a manner that in the Z direction (upward-downward direction) a difference between the upper end of the long hole 61a of the rotating body 61 of the second mount 25 and the upper end of the inserted pin 26a corresponds to the gap of the second predetermined length M2.

The gap of the first predetermined length M1 is smaller than the gap of the second predetermined length M2. That is, the opener 29 is moved in the backward direction BK by an amount corresponding to the gap of the first predetermined length M1. The amount of movement of the tape guide 23 in each of the backward direction BK and the tape feed direction FR is larger than a mounting tolerance between the opener 29 and the tape guide 23, and is smaller than the feed pitch PT (see FIG. 3B) of the tape feeding device 22. That is, the gap of the first predetermined length M1 is larger than the mounting tolerance between the opener 29 and the tape guide 23, and is smaller than the feed pitch PT (see FIG. 3B) of the tape feeding device 22. Accordingly, it is possible to significantly reduce or prevent an excessive increase in the amount of movement of the tape 3 in the backward direction BK, and thus it is possible to reduce waste of the amount of movement of the tape 3 in the backward direction BK.

<Movement of Opener>

The opener 29 is configured to be slid in the backward direction BK integrally with the tape guide 23 with movement of the tape 3 in the backward direction BK due to a frictional force (see FIG. 11) between the tape guide 23 and the tape 3 (FC portion).

Figure 9:
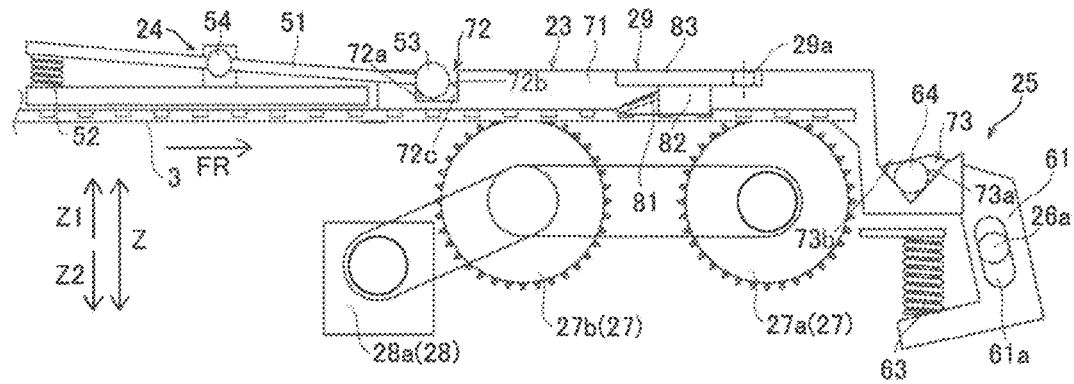
FIG. 9 is a schematic view showing a state in which the tape is being fed in a tape feed direction in the component supply device according to the first embodiment of the present disclosure.
Figure 10:
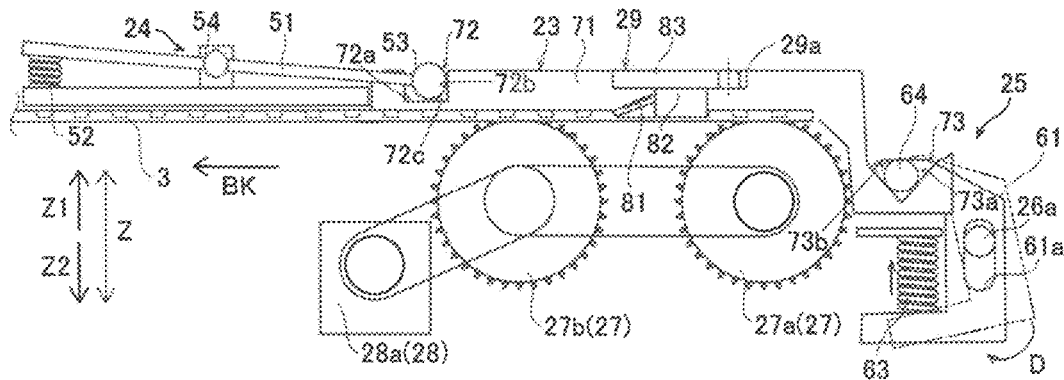
FIG. 10 is a schematic view showing a state in which the tape has been fed in the backward direction from the tape feed direction in the component supply device according to the first embodiment of the present disclosure.

Specifically, as shown in FIGS. 9 and 10, by the urging force of the urging portion 52 of the first mount 24 and the urging force of the urging portion 63 of the second mount 25, a pressing force that generates a frictional force that allows the tape guide 23 to move in the backward direction BK with movement of the tape 3 in the backward direction BK is generated. Thus, the tape guide 23 including the opener 29 is movable in the backward direction BK with movement of the tape 3 in the backward direction BK due to the frictional force generated by the urging force (pressing force).

The first engagement groove 72 is configured to restrict the amount of movement of the first engagement groove 72 with respect to the shaft 53 of the first mount 24 corresponding to the amount of movement of the tape guide 23 in the backward direction BK with movement of the tape 3 in the backward direction BK. That is, in the first engagement groove 72, movement of the tape guide 23 in the backward direction BK with movement of the tape 3 in the backward direction BK is restricted by the inner side surface 72b on the tape feed direction FR side among the pair of inner side surfaces 72a and 72b.

Specifically, when the tape guide 23 moves in the backward direction BK with movement of the tape 3 in the backward direction BK, the shaft 53 of the first mount 24 contacts the inner side surface 72b of the first engagement groove 72 on the tape feed direction FR side, and thus the amount of movement of the tape guide 23 in the backward direction BK is restricted to the first predetermined length M1.

Consequently, the amount (=M1) of movement of the tape guide 23 in the backward direction BK is limited to a range larger than the mounting tolerance between the opener 29 and the tape guide 23 and smaller than the feed pitch PT (see FIG. 3B) of the tape feeding device 22.

The tape guide 23, together with the tape 3, moves in the backward direction BK due to the frictional force between the tape guide 23 and the tape 3 (FC portion), and then the tape 3 slides in the tape feed direction FR such that the opener 29 slides in the tape feed direction FR integrally with the tape guide 23 with movement of the tape 3 in the tape feed direction FR.

Specifically, by the urging force of the urging portion 52 of the first mount 24 and the urging force of the urging portion 63 of the second mount 25, a frictional force that allows the tape guide 23 to move in the tape feed direction FR with movement of the tape 3 in the tape feed direction FR is generated to generate a pressing force. Thus, the tape guide 23 including the opener 29 is movable in the backward direction BK with movement of the tape 3 in the backward direction BK due to the frictional force generated by the urging force (pressing force).

The first engagement groove 72 is configured to restrict the amount of movement of the first engagement groove 72 with respect to the shaft 53 of the first mount 24 corresponding to the amount of movement of the tape guide 23 in the tape feed direction FR with movement of the tape 3 in the tape feed direction FR. That is, in the first engagement groove 72, movement of the tape guide 23 in the tape feed direction FR with movement of the tape 3 in the tape feed direction FR is restricted by the inner side surface 72a on the backward direction BK side among the pair of inner side surfaces 72a and 72b. The inner side surface 72a is an example of a "second restrictor" in the claims.

Specifically, when the tape guide 23 moves in the tape feed direction FR with movement of the tape 3 in the tape feed direction FR, the shaft 53 of the first mount 24 contacts the inner side surface 72a of the first engagement groove 72 on the backward direction BK side, and thus the amount of movement of the tape guide 23 in the tape feed direction FR is restricted to the first predetermined length M1.

Consequently, the amount of movement of the tape guide 23 in the tape feed direction FR is larger than the mounting tolerance between the opener 29 and the tape guide 23 and is smaller than the feed pitch PT (see FIG. 3B) of the tape feeding device 22.

<Feeding of Tape in Tape Feed Direction>

Movement of the tape guide 23 at the time of feeding the tape 3 in the tape feed direction FR is now described.

As shown in FIG. 9, when the tape 3 is being fed in the tape feed direction FR, the shaft 53 of the first mount 24 contacts the inner side surface 72a of the first engagement groove 72 of the tape guide 23 on the backward direction BK side. Thus, movement of the tape guide 23 in the tape feed direction FR is restricted, and only the tape 3 is fed in the tape feed direction FR.

The shaft 53 of the first mount 24 presses the first engagement groove 72 of the tape guide 23 in the Z2 direction (downward direction) by the urging portion 52. Furthermore, the shaft 64 of the second mount 25 presses the second engagement groove 73 of the tape guide 23 in the Z2 direction (downward direction) by the urging portion 63.

Figure 11:
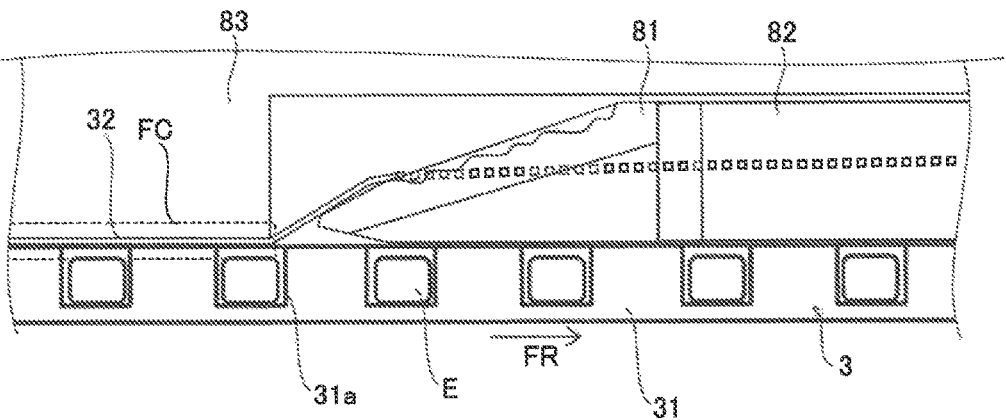
FIG. 11 is a side view schematically showing a state in which the cover tape is cut by the cutter in the component mounting device according to the first embodiment of the present disclosure.

Accordingly, movement of the tape guide 23 in the Z1 direction (upward direction) is restricted. At this time, as shown in FIG. 11, when the tape 3 is fed in the tape feed direction FR, the cover tape 32 is placed on the cutter 81 and is cut in the component supply device 2.

As shown in FIG. 9, in a state in which the movement in the tape feed direction FR is restricted by the shaft 53 of the first mount 24, the extraction hole 29a is arranged at a position that communicates with the upper opening of the storage 31a of the carrier tape 31. The nozzle of the mounting head 14a of the head unit 14 can suction the electronic component E through the extraction hole 29a.

<Feeding of Tape in Backward Direction from Tape Feed Direction>

Movement of the tape guide 23 at the time of feeding the tape 3 in the backward direction BK from the tape feed direction FR is now described.

As shown in FIG. 10, when the tape 3 has been fed in the backward direction BK from the tape feed direction FR, the shaft 53 of the first mount 24 contacts the inner side surface 72b of the first engagement groove 72 of the tape guide 23 on the tape feed direction FR side. Thus, movement of the tape guide 23 in the backward direction BK is restricted. That is, the tape guide 23 is moved in the backward direction BK by an amount corresponding to the gap of the first predetermined length M1, and the moved position is maintained. At this time, feeding of the tape 3 in the backward direction BK is stopped.

When the tape 3 has been fed in the backward direction BK from the tape feed direction FR, a force that causes the shaft 64 at the upper end of the rotating body 61 to move to the Z1 side (upper side) due to movement of the tape 3 in the backward direction BK is generated in the second mount 25. Thus, the pin 26a relatively moves upward along the long hole 61a, and thus the rotating body 61 is rotated in a D direction. At this time, the urging portion 63 is urged in the Z1 direction (upward direction).

The end of the tape guide 23 on the backward direction BK side is pressed in the Z2 direction (downward direction) by the shaft 53 of the first mount 24 while the end of the tape guide 23 on the tape feed direction FR side is pressed in the Z2 direction (downward direction) by the shaft 64 of the second mount 25, and thus movement of the tape guide 23 in the Z1 direction (upward direction) is restricted.

Figure 12:
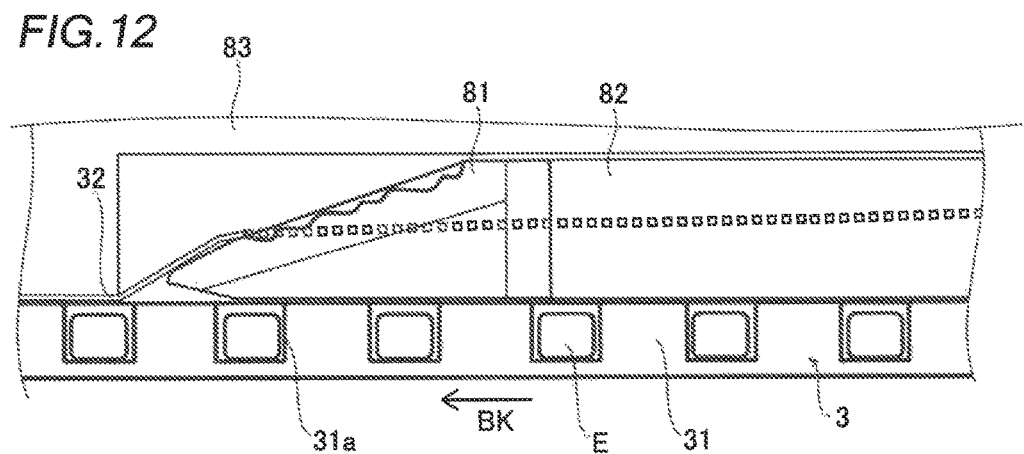
FIG. 12 is a side view schematically showing a state in which the tape has been moved in the backward direction when the cover tape is cut by the cutter in the component mounting device according to the first embodiment of the present disclosure.

At this time, as shown in FIG. 12, when the tape 3 has been fed in the backward direction BK from the tape feed direction FR, a state in which the cover tape 32 is placed on the cutter 81 is maintained in the component supply device 2. The extraction hole 29a is disposed at a position shifted in the backward direction BK with respect to the upper opening of the storage 31a of the carrier tape 31.

<Feeding of Tape in Tape Feed Direction from Backward Direction>

Movement of the tape guide 23 at the time of feeding the tape 3 in the tape feed direction FR from the backward direction BK is now described.

Figure 13:
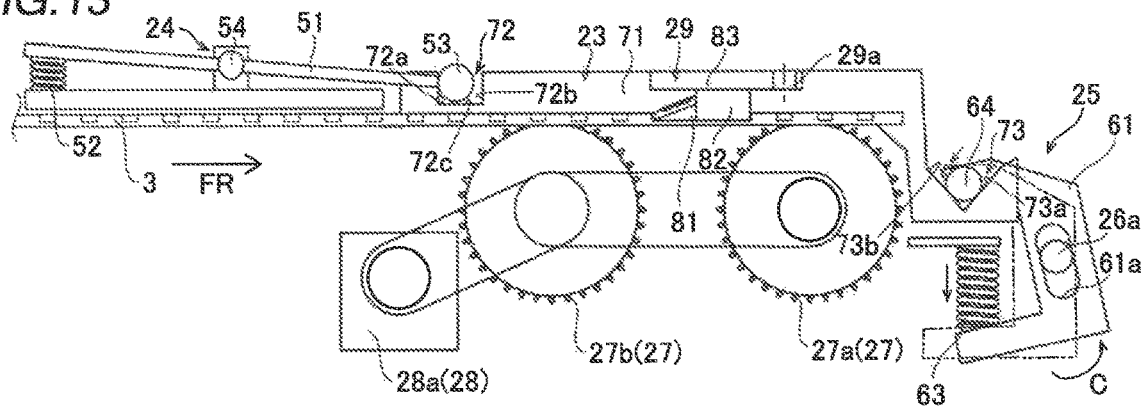
FIG. 13 is a schematic view showing a state in which the tape has been fed in the tape feed direction from the backward direction in the component supply device according to the first embodiment of the present disclosure.

As shown in FIG. 13, when the tape 3 has been fed in the tape feed direction FR from the backward direction BK, the shaft 53 of the first mount 24 contacts the inner side surface 72a of the first engagement groove 72 of the tape guide 23 on the backward direction BK side. Thus, movement of the tape guide 23 in the tape feed direction FR is restricted. That is, the tape guide 23 is moved in the tape feed direction FR by an amount corresponding to the gap of the first predetermined length M1, and the moved position is maintained. Thus, movement of the tape guide 23 in the tape feed direction FR is restricted, and only the tape 3 is fed in the tape feed direction FR.

When the tape 3 has been fed in the tape feed direction FR from the backward direction BK, a force that causes the shaft 64 at the upper end of the rotating body 61 to move to the Z2 side (lower side) due to movement of the tape 3 in the tape feed direction FR is generated in the second mount 25. Thus, the pin 26a relatively moves downward along the long hole 61a, and thus the rotating body 61 is rotated in the C direction. At this time, the urging portion 63 extends in the Z2 direction (downward direction).

The end of the tape guide 23 on the backward direction BK side is pressed in the Z2 direction (downward direction) by the shaft 53 of the first mount 24 while the end of the tape guide 23 on the tape feed direction FR side is pressed in the Z2 direction (downward direction) by the shaft 64 of the second mount 25, and thus movement of the tape guide 23 in the Z1 direction (upward direction) is restricted.

At this time, as shown in FIG. 11, when the tape 3 has been fed in the tape feed direction FR from the backward direction BK, a state in which the cover tape 32 is placed on the cutter 81 is maintained in the component supply device 2. The extraction hole 29a is disposed at a position that communicates with the upper opening of the storage 31a of the carrier tape 31. That is, movement of the tape guide 23 in the tape feed direction FR is restricted at the position at which the extraction hole 29a communicates with the upper opening of the storage 31a.

Advantageous Effects of First Embodiment

According to the first embodiment, the following advantageous effects are achieved.

According to this embodiment, as described above, the opener 29 is configured to move in the backward direction BK with movement of the tape 3 in the backward direction BK when the tape 3 is fed in the backward direction BK opposite to the tape feed direction FR. Accordingly, the tape 3 and the opener 29 move in the backward direction BK while the positional relationship between the tape 3 and the opener 29 is maintained such that a state in which the cover tape 32 is placed on the opener 29 can be maintained. Thus, the opener 29 can maintain a state in which the upper opening of the storage 31a of the carrier tape 31 is openable. Consequently, when the tape 3 is fed again, the opener 29 maintains a state in which the upper opening of the storage 31a of the carrier tape 31 is openable, and thus the electronic components E can be continuously exposed from the tape 3 when the tape 3 is fed again after being moved in the backward direction BK. Furthermore, the components can be reliably supplied to the mounting heads 14a of the head unit 14 accordingly.

According to the first embodiment, as described above, the opener 29 is configured to be slid in the backward direction BK with movement of the tape 3 in the backward direction BK due to the frictional force between at least one of the opener 29 and the tape guide 23 and the tape 3 (FC portion). Accordingly, the opener 29 is movable in the backward direction BK due to the frictional force, and thus it is not necessary to separately provide a drive source configured to slide the opener 29 in the backward direction BK. Thus, the structure of the component supply device 2 can be simplified.

According to the first embodiment, as described above, the component supply device 2 includes the shaft 53 of the first mount 24, the shaft 64 of the second mount 25, and the first engagement groove 72 and the second engagement groove 73 of the tape guide 23. The shaft 53 of the first mount 24 engages with the first engagement groove 72 in such a manner that the tape guide 23 including the opener 29 is movable in the backward direction BK with movement of the tape 3 in the backward direction BK due to the frictional force. Furthermore, the shaft 64 of the second mount 25 engages with the second engagement groove 73 in such a manner that the tape guide 23 including the opener 29 is movable in the backward direction BK with movement of the tape 3 in the backward direction BK due to the frictional force. Accordingly, using the engagement relationship between the shaft 53 of the first mount 24 and the first engagement groove 72 and the engagement relationship between the shaft 64 of the second mount 25 and the second engagement groove 73, the frictional force that allows the tape guide 23 including the opener 29 to move in the backward direction BK with movement of the tape 3 in the backward direction BK can be generated between the tape guide 23 and the tape 3. Consequently, it is not necessary to separately provide a structure configured to generate a frictional force, and thus the structure of the component supply device 2 can be simplified.

According to the first embodiment, as described above, the first engagement groove 72 includes the inner side surface 72a on the backward direction BK side, among the pair of inner side surfaces 72a and 72b, configured to restrict the amount of movement of the first engagement groove 72 with respect to the shaft 53 of the first mount 24 corresponding to the amount of movement of the tape guide 23 including the opener 29 in the backward direction BK with movement of the tape 3 in the backward direction BK. Accordingly, the amount of movement of the tape guide 23 including the opener 29 in the backward direction BK can be restricted by the inner side surface 72a of the first engagement groove 72 on the backward direction BK side, and thus it is not necessary to separately provide a member configured to restrict the amount of movement. Thus, the structure can be simplified.

According to the first embodiment, as described above, the component supply device 2 includes the shaft 64 of the second mount 25 disposed downstream of the extraction hole 29a in the tape feed direction FR, and the shaft 53 of the first mount 24 disposed upstream of the extraction hole 29a in the tape feed direction FR. The component supply device 2 includes the first engagement groove 72 corresponding to the shaft 53 of the first mount 24, and the second engagement groove 73 corresponding to the shaft 64 of the second mount 25. Accordingly, the shaft 53 of the first mount 24 and the shaft 64 of the second mount 25 press the first engagement groove 72 and the second engagement groove 73, respectively such that the tape guide 23 is pressed upstream and downstream of the extraction hole 29a, and thus a pressing force can be applied to the entire tape guide 23 as compared with the case in which one shaft is provided.

According to the first embodiment, as described above, the tape guide 23 is configured to move in the tape feed direction FR with movement of the tape 3 in the tape feed direction FR when the tape 3 moves in the tape feed direction FR after the tape guide 23 moves in the backward direction BK with movement of the tape 3 in the backward direction BK. Accordingly, in addition to moving the tape guide 23 in the backward direction BK in accordance with movement of the tape 3 in the backward direction BK, the tape guide 23 can return to the original position with movement of the tape 3 in the tape feed direction FR. Consequently, within a certain space (moving range), the tape guide 23 can repeatedly move in accordance with movement of the tape 3 in the backward direction BK and then return in the tape feed direction FR, and thus a space in the component supply device 2 can be effectively used.

According to the first embodiment, as described above, the first engagement groove 72 includes the inner side surface 72a on the backward direction BK side configured to restrict the amount of movement of the first engagement groove 72 with respect to the shaft 53 of the first mount 24 corresponding to the amount of movement of the tape guide 23 including the opener 29 in the tape feed direction FR with movement of the tape 3 in the tape feed direction FR. Movement of the tape guide 23 in the tape feed direction FR is restricted such that the inner side surface 72a of the first engagement groove 72 on the backward direction BK side stops the tape guide 23 at the position at which the extraction hole 29a and the upper opening of the storage 31a communicate with each other. Accordingly, the tape guide 23 can return to a position at which the extraction hole 29a and the upper opening of the storage 31a are aligned with each other, and thus the electronic component E can be easily extracted from the storage 31a when the tape 3 is fed again.

According to the first embodiment, as described above, the component supply device 2 includes the first mount 24 configured to attach the tape guide 23 to the supply device main body 26. Accordingly, the existing structure configured to attach the tape guide 23 to the supply device main body 26 is used, and thus the structure of the component supply device 2 can be further simplified.

Second Embodiment

The structure of a component supply device 202 according to a second embodiment of the present disclosure is now described with reference to FIGS. 14 to 17. In the second embodiment, an example is described in which a tape guide 223 is fixed to a supply device main body 26, and an opener 229 is attached to the tape guide 223 in such a manner as to be relatively movable with respect to the tape guide 223, unlike the aforementioned first embodiment. In the second embodiment, the same structures as those of the first embodiment are denoted by the same reference numerals, and description thereof is omitted.

Figure 14:
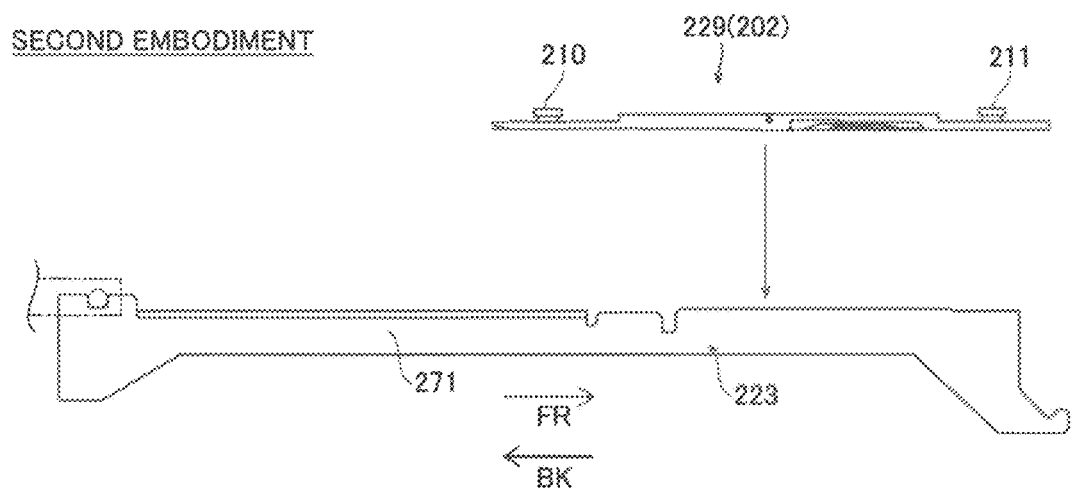
FIG. 14 is a schematic side view showing a tape guide and an opener in a component supply device according to a second embodiment of the present disclosure.
Figure 15A:
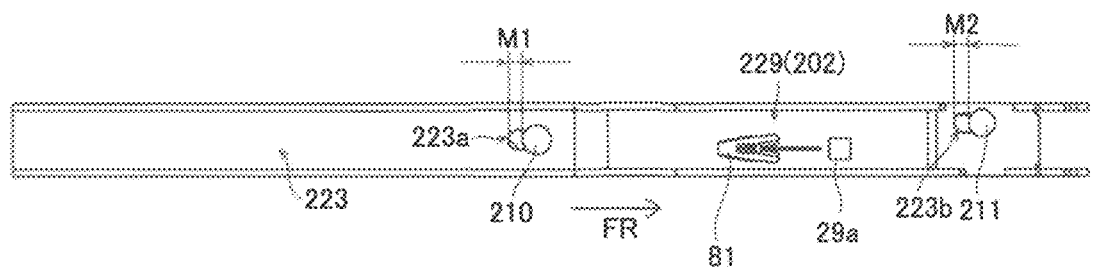
FIG. 15A is a plan view showing a state in which a tape is being fed in a tape feed direction in the component supply device according to the second embodiment of the present disclosure.

As shown in FIG. 14, the tape guide 223 fixed to the supply device main body 26 includes a cover 271 and the opener 229 attached to the cover 271. The opener 229 includes a first attachment 210 at its end on the backward direction BK side and a second attachment 211 at its end on the tape feed direction FR side. As shown in FIG. 15A, the tape guide 223 includes a first mounting long hole 223a through which the first attachment 210 is inserted, and a second mounting long hole 223b through which the second attachment 211 is inserted. The first mounting long hole 223a is elongated in a tape feed direction FR. The second mounting long hole 223b is elongated in the tape feed direction FR.

A gap of a first predetermined length M1 is formed between the first mounting long hole 223a of the tape guide 223 and the inserted first attachment 210. Specifically, the first mounting long hole 223a is configured in such a manner that a difference between an end of the first mounting long hole 223a on the backward direction BK side and an end of the first attachment 210 on the backward direction BK side corresponds to the gap of the first predetermined length M1.

A gap of a second predetermined length M2 is formed between the second mounting long hole 223b of the tape guide 223 and the inserted second attachment 211. Specifically, the second mounting long hole 223b is configured in such a manner that a difference between an end of the second mounting long hole 223b on the backward direction BK side and an end of the second attachment 211 on the backward direction BK side corresponds to the gap of the second predetermined length M2.

The gap of the first predetermined length M1 is smaller than the gap of the second predetermined length M2. That is, the opener 229 is moved in a backward direction BK by an amount corresponding to the gap of the first predetermined length M1.

Figure 16:
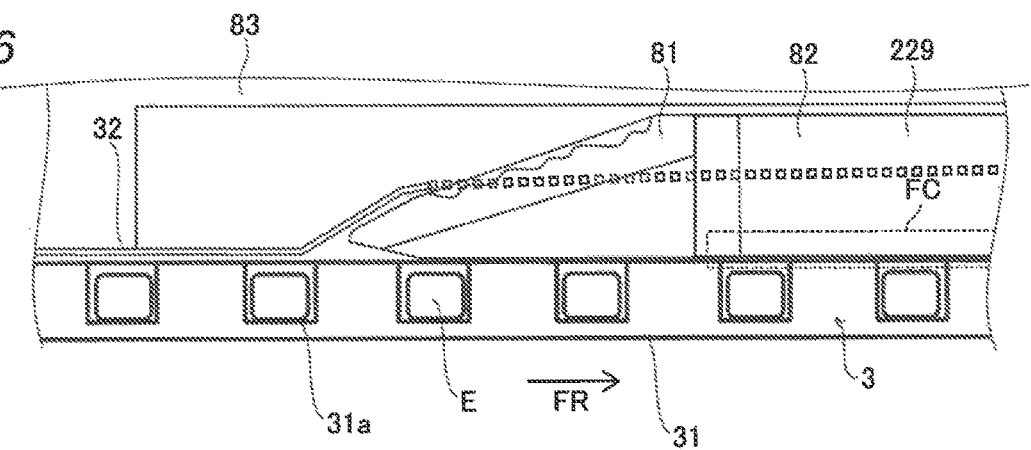
FIG. 16 is a side view schematically showing a state in which a cover tape is cut by a cutter in a component mounting device according to the second embodiment of the present disclosure.
Figure 17:
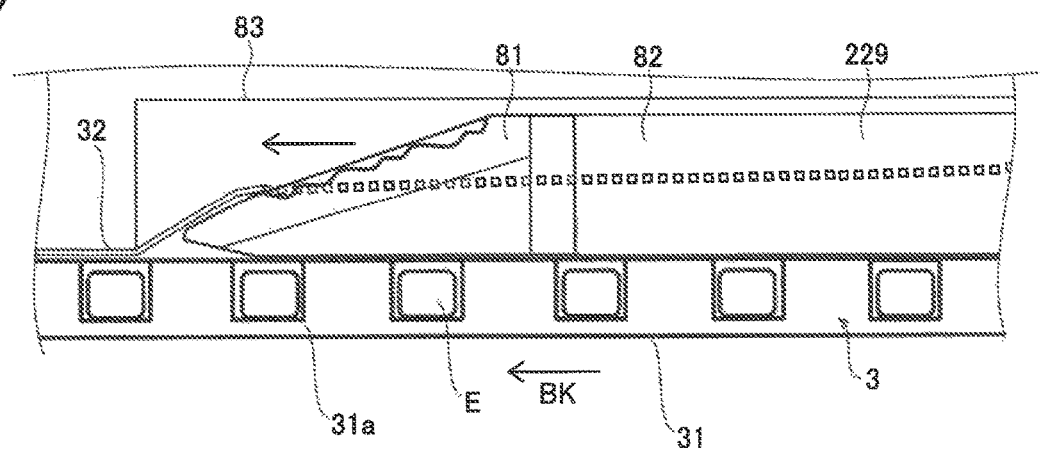
FIG. 17 is a side view schematically showing a state in which the tape has been moved in the backward direction when the cover tape is cut by the cutter in the component mounting device according to the second embodiment of the present disclosure.

As described above, the first attachment 210 is inserted through and attached to the first mounting long hole 223a while the second attachment 211 is inserted through and attached to the second mounting long hole 223b such that the opener 229 is attached to the tape guide 223 in such a manner as to be movable in the tape feed direction FR and the backward direction BK. That is, as shown in FIGS. 16 and 17, when a tape 3 is moved in the backward direction BK, due to a frictional force between the opener 229 and a carrier tape 31, the opener 229 is moved in the backward direction BK with movement of the tape 3 in the backward direction BK in a state in which the position of the tape guide 223 is maintained. The remaining structures of the second embodiment are similar to those of the first embodiment.

<Feeding of Tape in Tape Feed Direction>

Movement of the tape guide 223 at the time of feeding the tape 3 in the tape feed direction FR is now described.

As shown in FIG. 15A, when the tape 3 is being fed in the tape feed direction FR, the first attachment 210 contacts the inner side surface of the first mounting long hole 223a of the tape guide 223 on the tape feed direction FR side. Thus, movement of the opener 229 in the tape feed direction FR is restricted. As shown in FIG. 16, when the tape 3 is being fed in the tape feed direction FR, a cover tape 32 is placed on a cutter 81 and is cut in the component supply device 202.

<Feeding of Tape in Backward Direction from Tape Feed Direction>

Movement of the tape guide 223 at the time of feeding the tape 3 in the tape feed direction FR from the backward direction BK is now described.

Figure 15B:
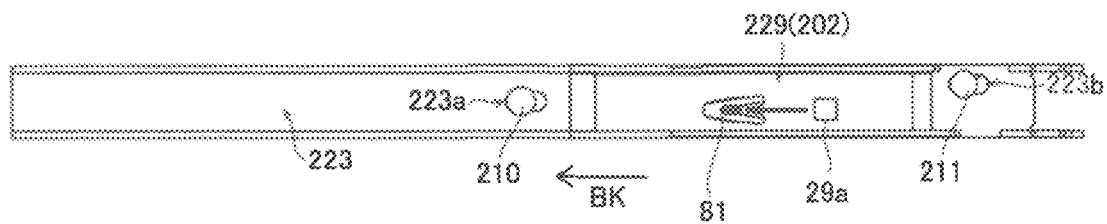
FIG. 15B is a plan view showing a state in which the tape has been fed in a backward direction from the tape feed direction in the component supply device according to the second embodiment of the present disclosure.

As shown in FIG. 15B, when the tape 3 has been fed in the backward direction BK from the tape feed direction FR, the first attachment 210 contacts the inner side surface of the first mounting long hole 223a of the tape guide 223 on the backward direction BK side. Thus, movement of the opener 229 in the backward direction BK is restricted. At this time, the opener 229 has moved in the backward direction BK by an amount corresponding to the first predetermined length M1. As shown in FIG. 17, when the tape 3 has been fed in the backward direction BK from the tape feed direction FR, a state in which the cover tape 32 is placed on the cutter 81 is maintained in the component supply device 202. Furthermore, feeding of the tape 3 in the backward direction BK is stopped.

Advantageous Effects of Second Embodiment

According to the second embodiment, the following advantageous effects are achieved.

According to the second embodiment, as described above, the tape guide 223 is fixed. Furthermore, the opener 229 is attached to the tape guide 223 in such a manner as to be relatively movable with respect to the tape guide 223, and is configured to be moved in the backward direction BK with movement of the tape 3 in the backward direction BK due to the frictional force between the opener 229 and the tape 3 (FC portion) in a state in which the position of the tape guide 223 is maintained when the tape 3 is moved in the backward direction BK. Accordingly, only the opener 229 is configured to be moved in the backward direction BK such that a frictional force required to move the opener 229 in the backward direction BK can be reduced as compared with the case in which both the opener 229 and the tape guide 223 are moved in the backward direction. Accordingly, the drive load of a tape feeding device 22 can be reduced. The remaining advantageous effects of the second embodiment are similar to those of the first embodiment.

Modified Examples

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, while the example in which the cover tape 32 is cut by the cutter 81 in the opener 29 (229) such that the electronic components E in the storages 31a of the carrier tape 31 are exposed has been shown in each of the aforementioned first and second embodiments, the present disclosure is not restricted to this. In the present disclosure, a bonded portion between the cover tape and the carrier tape by an adhesive may be peeled off in the opener such that the electronic components in the storages of the carrier tape are exposed.

While the example in which the tape guide 23 (223) is configured to be restricted from moving in the backward direction BK has been shown in each of the aforementioned first and second embodiments, the present disclosure is not restricted to this. In the present disclosure, movement of the tape guide in the backward direction may not be restricted, and the amount of movement in the backward direction may be adjusted by the feed amount of the tape feeding device.

While the example in which when the shaft 53 of the first mount 24 contacts the pair of inner side surfaces 72a and 72b of the first engagement groove 72 of the tape guide 23 such that movement of the opener 29 in the tape feed direction FR or the backward direction BK is restricted has been shown in the aforementioned first embodiment, the present disclosure is not restricted to this. In the present disclosure, the pin may contact the inner side surface of the long hole of the second mount such that movement of the opener in the tape feed direction or the backward direction is restricted.

While the example in which the first attachment 210 contacts the inner side surface of the first mounting long hole 223a of the tape guide 223 such that movement of the opener 229 in the tape feed direction FR or the backward direction BK of the opening portion 229 is restricted has been shown in the aforementioned second embodiment, the present disclosure is not restricted to this. In the present disclosure, the second attachment may contact the inner side surface of the second mounting long hole of the tape guide such that movement of the opener in the tape feed direction or the backward direction is restricted.

While the example in which the first predetermined length M1 is larger than the second predetermined length M2 has been shown in each of the aforementioned first and second embodiments, the present disclosure is not restricted to this. In the present disclosure, the second predetermined length may be larger than the first predetermined length.

While the example in which the first sprocket 27a and the second sprocket 27b are driven in conjunction with each other has been shown in each of the aforementioned first and second embodiments, the present disclosure is not restricted to this. In the present disclosure, each of the first sprocket and the second sprocket may be independently driven.

While the example in which the extraction hole 29a is formed in the mount 83 of the opener 29 (229) has been shown in each of the aforementioned first and second embodiments, the present disclosure is not restricted to this. In the present disclosure, the extraction hole may be formed in the cover of the tape guide.

While the example in which the first moment M1 and the second moment M2 are balanced about the extraction hole 29a has been shown in the aforementioned first embodiment, the present disclosure is not restricted to this. In the present disclosure, the first moment and the second moment may be balanced about a position other than the position of the extraction hole.

The invention claimed is:

1. A component supply device comprising:
   a tape feeder configured to feed a tape, the tape including a carrier tape having a storage configured to store a component and a cover tape configured to cover an upper opening of the storage; and
   a tape guide including an opener configured to open the upper opening of the storage covered with the cover tape and expose the component, and an extraction hole through which the component exposed by the opener is extracted, the tape guide being configured to guide the tape, wherein
   the opener is arranged at a vicinity and upstream side of the extraction hole, and
   the opener is configured to move in a second direction with movement of the tape in the second direction when the tape is fed in the second direction opposite to a first direction in which the tape is fed from the tape feeder to the opener.

2. The component supply device according to claim 1, further comprising:
   a first engagement portion configured to engage with the tape guide to urge the tape guide against the tape; and a second engagement portion provided in the tape guide and configured to engage with the first engagement portion, wherein the opener is configured to slide in the second direction with the movement of the tape in the second direction due to a frictional force between the tape and at least one of the opener and the tape guide which is generated when the tape is pressed by urging the tape guide against the tape.

3. The component supply device according to claim 1, further comprising:

a first engagement portion configured to engage with the tape guide to urge the tape guide against the tape; and a second engagement portion provided in the tape guide and configured to engage with the first engagement portion, and the second engagement portion being configured to engage with the first engagement portion in such a manner that the tape guide, including the opener, is movable in the second direction with the movement of the tape in the second direction due to a frictional force between the tape guide, against which the second engagement portion is urged, and the tape which is generated when the tape is pressed by urging the tape guide against the tape.

4. The component supply device according to claim 3, wherein the second engagement portion includes a first restrictor configured to restrict an amount of movement of the second engagement portion with respect to the first engagement portion, the amount of movement corresponding to an amount of movement of the tape guide, including the opener, in the second direction with the movement of the tape in the second direction.

5. The component supply device according to claim 3, wherein the first engagement portion includes a first downstream engagement portion disposed downstream of the extraction hole in the first direction, and a first upstream engagement portion disposed upstream of the extraction hole in the first direction; and the second engagement portion includes a second downstream engagement portion corresponding to the first downstream engagement portion, and a second upstream engagement portion corresponding to the first upstream engagement portion.

6. The component supply device according to claim 3, wherein the tape guide is configured to move in the first direction with movement of the tape in the first direction when the tape moves in the first direction after the tape guide moves in the second direction with the movement of the tape in the second direction.

7. The component supply device according to claim 6, wherein the second engagement portion includes a second restrictor configured to restrict an amount of movement of the second engagement portion with respect to the first engagement portion, the amount of movement corresponding to an amount of movement of the tape guide, including the opener, in the first direction with the movement of the tape in the first direction; and the movement of the tape guide in the first direction is restricted such that the second restrictor stops the tape guide at a position at which the extraction hole and the upper opening of the storage communicate with each other.

8. The component supply device according to claim 3, further comprising a fixing member configured to fix the tape guide; wherein the first engagement portion is provided on the fixing member.

9. The component supply device according to claim 1, further comprising:

a first engagement portion configured to engage with the tape guide to urge the tape guide against the tape; and a second engagement portion provided in the tape guide and configured to engage with the first engagement portion, wherein the tape guide is fixed; and the opener is attached to the tape guide such that the opener is relatively movable with respect to the tape guide, and is configured to move in the second direction with the movement of the tape in the second direction due to a frictional force between the opener and the tape which is generated when the tape is pressed by urging the tape guide against the tape and in a state in which a position of the tape guide is maintained when the tape is moved in the second direction.

10. A component mounting device comprising:

a head unit including a head configured to mount a component on a substrate; and a component supply device configured to supply the component to the head; wherein the component supply device includes:

a tape feeder configured to feed a tape, the tape including a carrier tape having a storage configured to store the component and a cover tape configured to cover an upper opening of the storage; and a tape guide including an opener configured to open the upper opening of the storage covered with the cover tape and expose the component, and an extraction hole through which the component exposed by the opener is extracted, the tape guide being configured to guide the tape, wherein the opener is arranged at a vicinity and upstream side of the extraction hole, and the opener is configured to move in a second direction with movement of the tape in the second direction when the tape is fed in the second direction opposite to a first direction in which the tape is fed from the tape feeder to the opener.

11. The component supply device according to claim 2, wherein the second engagement portion is configured to engage with the first engagement portion in such a manner that the tape guide, including the opener, is movable in the second direction with the movement of the tape in the second direction due to a frictional force between the tape guide, against which the second engagement portion is urged, and the tape which is generated when the tape is pressed by urging the tape guide against the tape.

12. The component supply device according to claim 4, wherein the first engagement portion includes a first downstream engagement portion disposed downstream of the extraction hole in the first direction, and a first upstream engagement portion disposed upstream of the extraction hole in the first direction; and the second engagement portion includes a second downstream engagement portion corresponding to the first downstream engagement portion, and a second upstream engagement portion corresponding to the first upstream engagement portion.

13. The component supply device according to claim 4, wherein
the tape guide is configured to move in the first direction with movement of the tape in the first direction when the tape moves in the first direction after the tape guide moves in the second direction with the movement of the tape in the second direction.

14. The component supply device according to claim 5, wherein
the tape guide is configured to move in the first direction with movement of the tape in the first direction when the tape moves in the first direction after the tape guide moves in the second direction with the movement of the tape in the second direction.

15. The component supply device according to claim 4, further comprising a fixing member configured to fix the tape guide; wherein
the first engagement portion is provided on the fixing member.

16. The component supply device according to claim 5, further comprising a fixing member configured to fix the tape guide; wherein
the first engagement portion is provided on the fixing member.

17. The component supply device according to claim 6, further comprising a fixing member configured to fix the tape guide; wherein
the first engagement portion is provided on the fixing member.

18. The component supply device according to claim 7, further comprising a fixing member configured to fix the tape guide; wherein
the first engagement portion is provided on the fixing member.

19. The component supply device according to claim 2, wherein
the tape guide is fixed; and
the opener is attached to the tape guide such that the opener is relatively movable with respect to the tape guide, and is configured to move in the second direction with the movement of the tape in the second direction due to a frictional force between the opener and the tape which is generated when the tape is pressed by urging the tape guide against the tape and in a state in which a position of the tape guide is maintained when the tape is moved in the second direction.

20. The component supply device according to claim 11, wherein
the second engagement portion includes a first restrictor configured to restrict an amount of movement of the second engagement portion with respect to the first engagement portion, the amount of movement corresponding to an amount of movement of the tape guide, including the opener, in the second direction with the movement of the tape in the second direction.

* * * * *